United States Patent [19]
Kliman et al.

[11] Patent Number: 5,345,158
[45] Date of Patent: Sep. 6, 1994

[54] ELECTRICAL DISTRIBUTION EQUIPMENT WITH TORQUE ESTIMATING CAPABILITY

[75] Inventors: Gerald B. Kliman, Schenectady, N.Y.; Kamakshi Srinivasan, Cambridge, Mass.; Rik W. DeDoncker, Schenectady; David E. Ritscher, Troy, both of N.Y.

[73] Assignee: General Electric Company, Schenectady, N.Y.

[21] Appl. No.: 955,808

[22] Filed: Oct. 2, 1992

[51] Int. Cl.[5] ............................................. H02K 17/32
[52] U.S. Cl. ..................................... 318/434; 361/30; 361/79; 318/432
[58] Field of Search ........................ 361/23, 30, 31, 33, 361/79, 92, 142, 85, 86, 87, 66; 318/803, 807, 802, 800, 798, 434, 432–433

[56] References Cited

U.S. PATENT DOCUMENTS

| | | | |
|---|---|---|---|
| 3,432,841 | 3/1969 | Harvey et al. | 361/23 |
| 3,727,103 | 4/1973 | Finch et al. | 361/79 |
| 4,251,896 | 2/1981 | Pearson et al. | 361/30 |
| 4,585,985 | 4/1986 | Bose | 318/803 |
| 4,669,024 | 5/1987 | Stacey | 361/86 |
| 4,754,247 | 6/1988 | Raymont et al. | 335/202 |
| 4,835,651 | 5/1989 | Li et al. | 361/79 |
| 4,890,184 | 12/1989 | Russell | 361/92 |
| 4,922,363 | 5/1990 | Long et al. | 361/87 |
| 4,965,513 | 10/1990 | Haynes et al. | 324/158 |
| 4,978,909 | 12/1990 | Hendrix et al. | 324/77 B |
| 5,170,308 | 12/1992 | Inagaki et al. | 361/79 |
| 5,170,310 | 12/1992 | Stodtman et al. | 361/79 |

OTHER PUBLICATIONS

G. B. Kliman et al., The Limits of Motor Current Signature Analysis, Mechanical Failures Prevention Group 46th Meeting, Apr. 7–9, 1992, Virginia Beach, Va.

*Primary Examiner*—William M. Shoop, Jr.
*Assistant Examiner*—John W. Cabeca
*Attorney, Agent, or Firm*—Jill M. Breedlove; Marvin Snyder

[57] ABSTRACT

A circuit breaker for protecting a motor-driven system from overcurrents and undervoltages includes both current and voltage sensors and derives a precise estimate of electromagnetic torque output from sensed currents and voltages. A contactor similarly includes torque estimating capability.

21 Claims, 4 Drawing Sheets

ELECTRICAL DISTRIBUTION EQUIPMENT WITH TORQUE ESTIMATING CAPABILITY

FIELD OF THE INVENTION

The present invention relates generally to electrical distribution equipment. More particularly, the present invention relates to a circuit breaker or a contactor including torque estimating apparatus for deriving torque measurements from circuit breaker or contactor sensors employed therein.

BACKGROUND OF THE INVENTION

In a motor system, it is often necessary to monitor the torque produced by the motor, particularly if the motor is being used to drive a complex load, such as, for example, a pump or a valve. Electromechanical torque transducer systems are sometimes employed, but are limited due to physical constraints, high costs, and lack of reliability and robustness. A recent alternative for monitoring torque relies on the current sensed by a single current transformer in one of three phases supplying the drive motor. In particular, the current is assumed to represent a scaled version of the actual torque produced by the motor.

Unfortunately, however, as derived from the steady-state equivalent circuit of an induction motor, the relationship between current and output torque (or shaft torque) is not fixed, but varies as both power factor and efficiency change at different loads and speeds, as shown in FIG. 1. Other factors which affect the relationship between current and shaft torque include rotor electrical and mechanical time constants and saturation. Therefore, using current to deduce the state of the load and the nature of faults results in significant errors.

Another method for monitoring torque output in an induction motor involves a model-based approach wherein knowledge of motor parameters (e.g., rotor and stator resistances, leakage inductances and magnetizing inductance) and motor speed is required in addition to motor currents and voltages. Unfortunately, however, motor parameters must be given, measured or estimated; and estimation under transient conditions is difficult and may involve complex computations.

Accordingly, it is desirable to provide means for precisely estimating torque in an induction motor using both current and voltage information, which information can be provided from circuit breaker sensors that function to protect the motor from overcurrents and undervoltages. Similarly, such information can be provided from contactor sensors or similar devices in a motor control center. Furthermore, it is desirable that such torque measurements be made without requiring measurements of motor parameters or speed.

SUMMARY OF THE INVENTION

A circuit breaker for protecting a motor-driven system from overcurrents and undervoltages includes current and voltage sensors and torque estimating means for generating torque measurements from sensed currents and voltages. The torque estimating means is implemented in software on a computer control chip for the circuit breaker. Advantageously, therefore, the state of the load on the motor shaft is precisely determined without requiring knowledge of speed or parameters of the motor.

In similar fashion, a contactor includes current and voltage sensors and torque estimating means for generating torque measurements from sensed currents and voltages.

BRIEF DESCRIPTION OF THE DRAWINGS

The features and advantages of the present invention will become apparent from the following detailed description of the invention when read with the accompanying drawing in which.

DETAILED DESCRIPTION OF THE INVENTION

Figure 2:
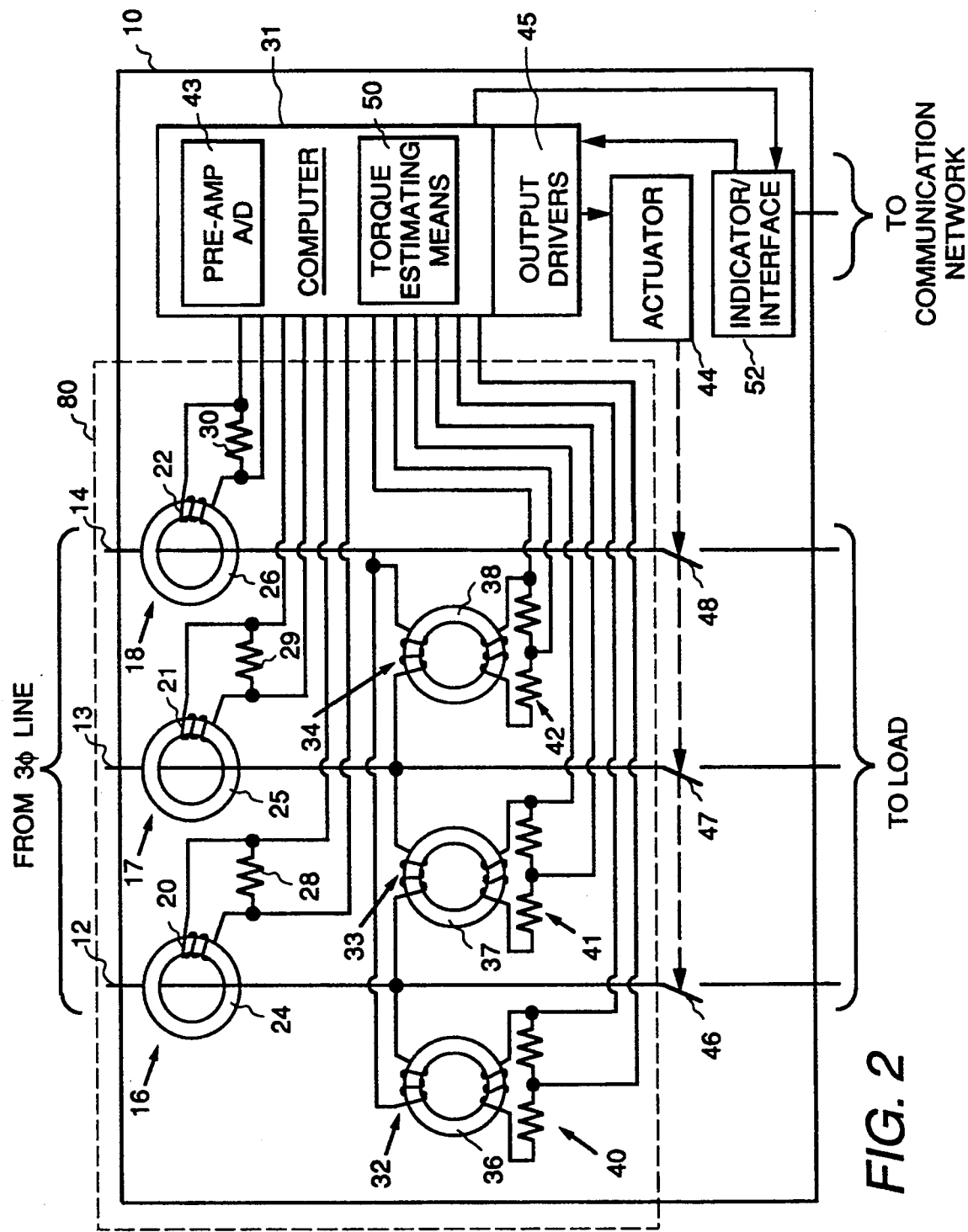
FIG. 2 is a schematic diagram illustrating a circuit breaker or contactor including torque estimating means according to the present invention.

FIG. 2 schematically illustrates a circuit breaker or contactor for a motor-driven system according to the present invention including means for providing precise measurements of the output torque of the motor. The circuit breaker or contactor of FIG. 2 is illustrated as being contained within a case 10. Input lines 12-14 are coupled to a three-phase ac power source (not shown). Currents in lines 12-14 are sensed by current sensors 16-18, respectively, which are illustrated in FIG. 2 as comprising current transformers. However, other suitable current sensors may be used, such as, for example, Hall-effect current sensors or flux-null systems. Each current transformer comprises a coil 20-22 wound about a respective transformer core 24-26. A resistor 28-30 is coupled across each coil 20-22, respectively, such that the voltage across the respective resistor 28-30 is proportional to the current through the corresponding input line 12-14, respectively. The output of each current transformer is provided to a computer system 31 for controlling the circuit breaker.

Figure 1:
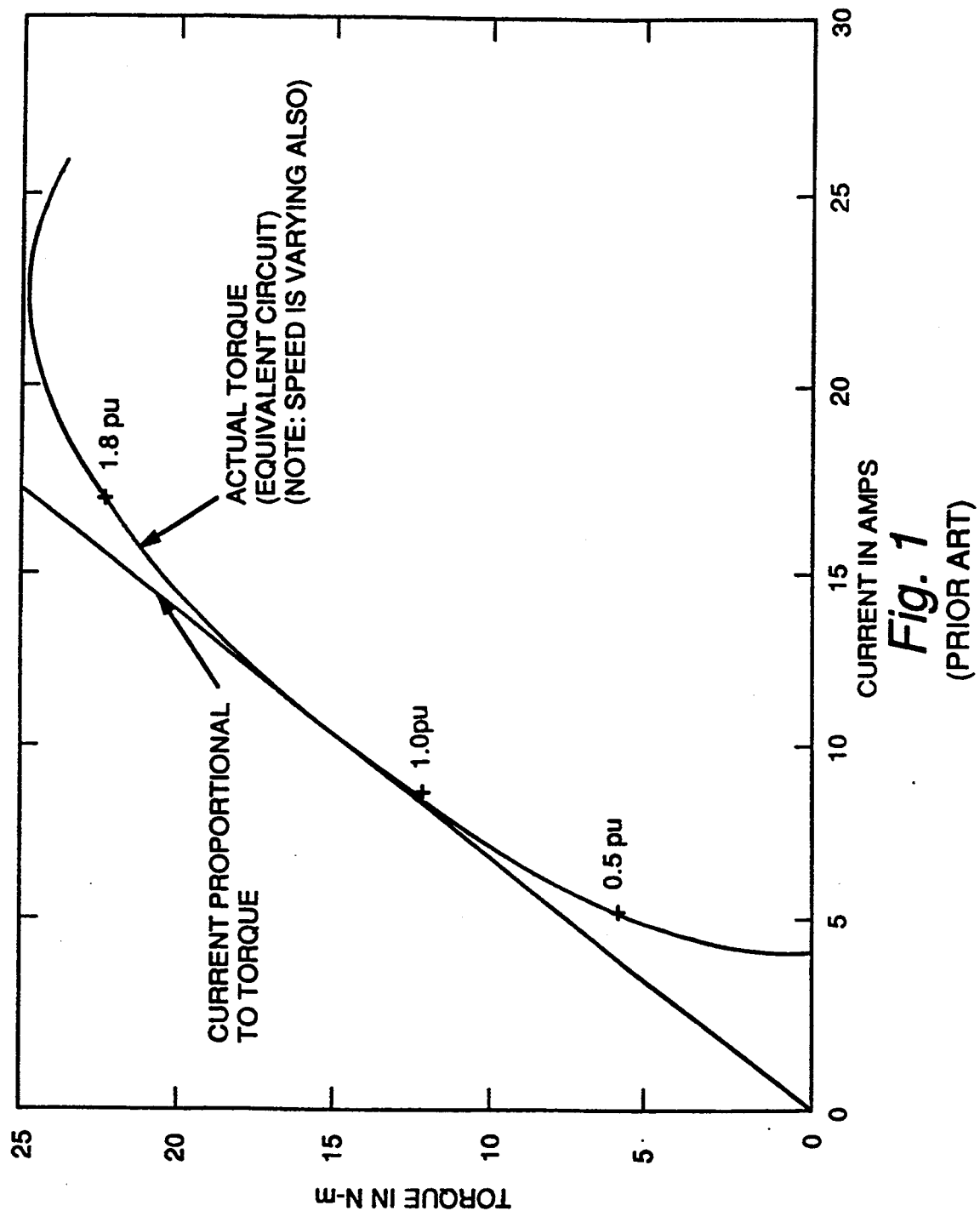
FIG. 1 is a graphical representation of shaft torque as a function of line current for a typical motor.

The circuit breaker or contactor of FIG. 1 further includes voltage sensors 32-34 for sensing the voltage across each motor phase. The voltage sensors are illustrated as comprising potential transformers 36-38 and resistive voltage dividers 40-42. However, other suitable voltage sensors may be used such as capacitive or resistive voltage dividers. The voltage at the output of each divider 40-42 is provided to computer system 31 (via analog-to-digital A/D converters 43) and is proportional to the respective motor phase voltage.

A contact actuator 44 is controlled by computer system 31 via output driver circuitry 45 for opening or closing contacts 46-48 in response to an overcurrent or undervoltage (i.e., for a circuit breaker) or another predetermined current signal (i.e., for a contactor), as sensed by current sensors 16-18, in well-known fashion. Alternatively, actuator 44 may be controlled via computer system 31 by a remote command according to methods well-known in the art.

Computer system 31 further comprises torque estimating means 50 for supplying torque estimates to an indicator/interface 52 which supplies the torque measurements to a communication network, as illustrated, or provides a read-out of the torque measurements either locally or remotely, as desired.

In accordance with the present invention, torque estimating means 50 generates torque estimates in response to the measured currents and voltages from sensors 16–18 and 32–34, respectively, using the following expression for electromagnetic torque $T_e$ in an electrical machine:

$$T_e = \frac{1}{2} i^T \frac{dL(\theta)}{d\theta} i \quad (1)$$

where $L(\theta)$ represents an inductance matrix for the motor, and $i^T$ represents the transpose of the current vector i where:

$$i = [i_{s1}, i_{s2}, i_{s3}, i_{r1}, i_{r2}, i_{r3}],$$
and $$i^T = \begin{bmatrix} i_{s1} \\ i_{s2} \\ i_{s3} \\ i_{r1} \\ i_{r2} \\ i_{r3} \end{bmatrix},$$

with $i_{si}$ representing the three-phase stator currents and $i_{ri}$ representing the three-phase rotor currents (subscript i=1, 2, 3). Similarly, the three-phase stator and rotor voltages are represented by the vector:

$$v = [v_{s1}, v_{s2}, v_{s3}, v_{r1}, v_{r2}, v_{r3}].$$

The voltages may then be integrated to provide the flux linkages:

$$\lambda = [\lambda_{s1}, \lambda_{s2}, \lambda_{s3}, \lambda_{r1}, \lambda_{r2}, \lambda_{r3}].$$

Transforming all variables in equation (1) to a stator reference frame and from a three-phase to two-phase coordinate system in well-known manner, the electromagnetic torque $T_e$ may be represented in terms of the stator flux linkages and the stator currents as:

$$T_e = \frac{3}{2} p [\lambda_{sd} i_{sq} - i_{sd} \lambda_{sq}] \quad (2)$$

where p represents the pole pair number; and $\lambda_{sd}$, $\lambda_{sq}$, $i_{sd}$, and $i_{sq}$ are the two-phase components of the stator fluxes and the stator currents, respectively. The transformed two-phase components of the stator currents and stator voltages are represented in terms of the three-phase components as follows:

$$i_{sd} = i_{s1};$$

$$i_{sq} = \frac{\sqrt{3}}{3}(i_{s2} - i_{s3}) = \frac{\sqrt{3}}{3}(i_{s1} + 2i_{s2});$$

$$v_{sd} = v_{s1};$$

$$v_{sq} = \frac{\sqrt{3}}{3}(v_{s2} - v_{s3}) = \frac{\sqrt{3}}{3}(v_{s1} + 2v_{s2}).$$

The transformed components of the stator currents and stator fluxes may also be related as follows:

$$\frac{d}{dt} \begin{bmatrix} \lambda_{sd} \\ \lambda_{sq} \end{bmatrix} = \begin{bmatrix} v_{sd} \\ v_{sq} \end{bmatrix} - \begin{bmatrix} i_{sd} \\ i_{sq} \end{bmatrix} \begin{bmatrix} r_s & 0 \\ 0 & r_s \end{bmatrix}, \quad (3)$$

where $r_s$ represents the stator resistance. The stator voltages and currents are measured by the voltage and current sensors, as described hereinabove; and the stator resistance $r_s$ is easily measured. (Use of the stator resistance measurement improves the precision of the torque estimations.) Torque is thus determined precisely from these measurements by torque estimating means 50 using equations (2) and (3).

Figure 3A:
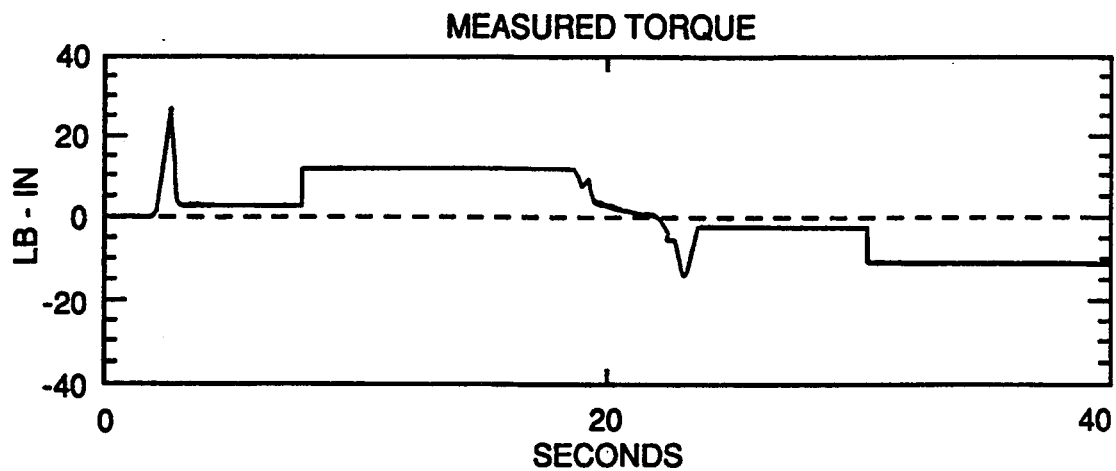
FIG. 3 graphically represents: (a) measured torque according to conventional mechanical methods; (b) a torque estimate according to the present invention; and (c) RMS motor current.
Figure 3B:
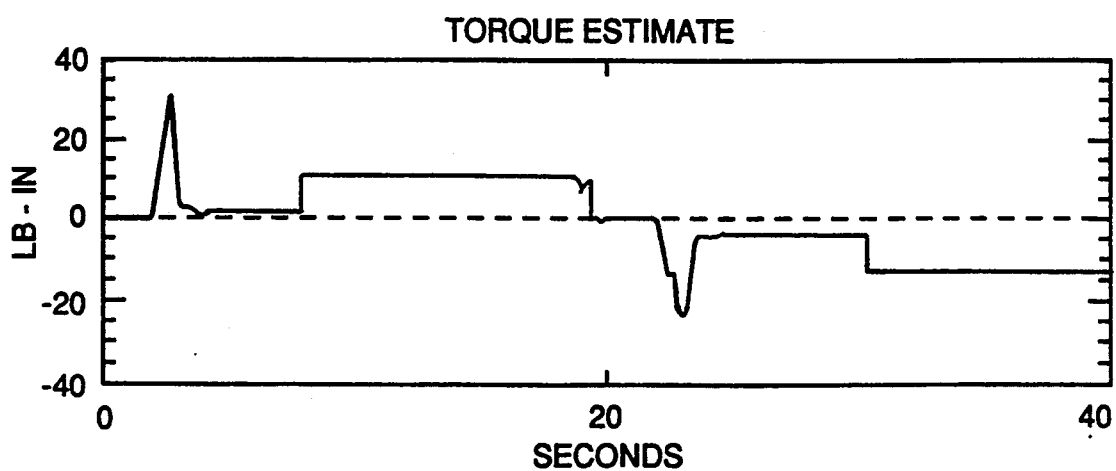
Figure 3C:
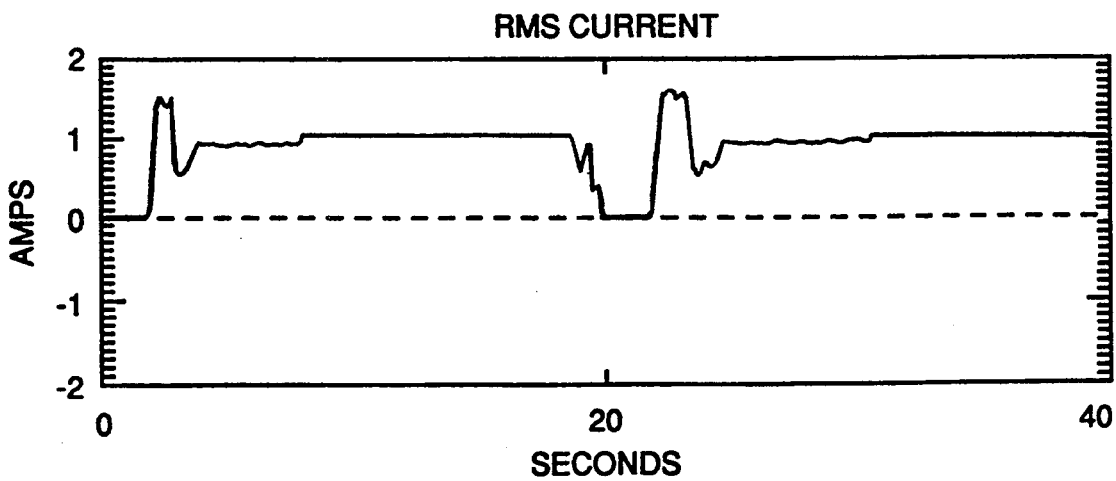

For comparison, FIG. 3a graphically illustrates torque measured during operation of a three-phase motor using an electromechanical torque transducer, and FIG. 3b illustrates torque estimated according to the present invention. FIG. 3c illustrates the RMS motor current. By comparing the graphs of FIGS. 3a and 3b, it is apparent that the torque estimating means of the present invention provides precise torque estimations. In fact, the torque estimating means provides an even better measure of torque than the torque transducer at zero torque. Moreover, the graph of FIG. 3c, as compared with the graphs of FIGS. 3a and 3b, further exemplifies how current is not a scaled version of the actual torque produced by the motor.

According to an alternative embodiment, the voltage and current sensors are contained within a module 80 separate from computer system 31 and the circuit breaker or contactor, as indicated by the dashed lines in FIG. 2. In this way, even higher precision voltage and current measurements, and hence torque estimates, are derived by avoiding the use of miniaturized components.

Figure 4:
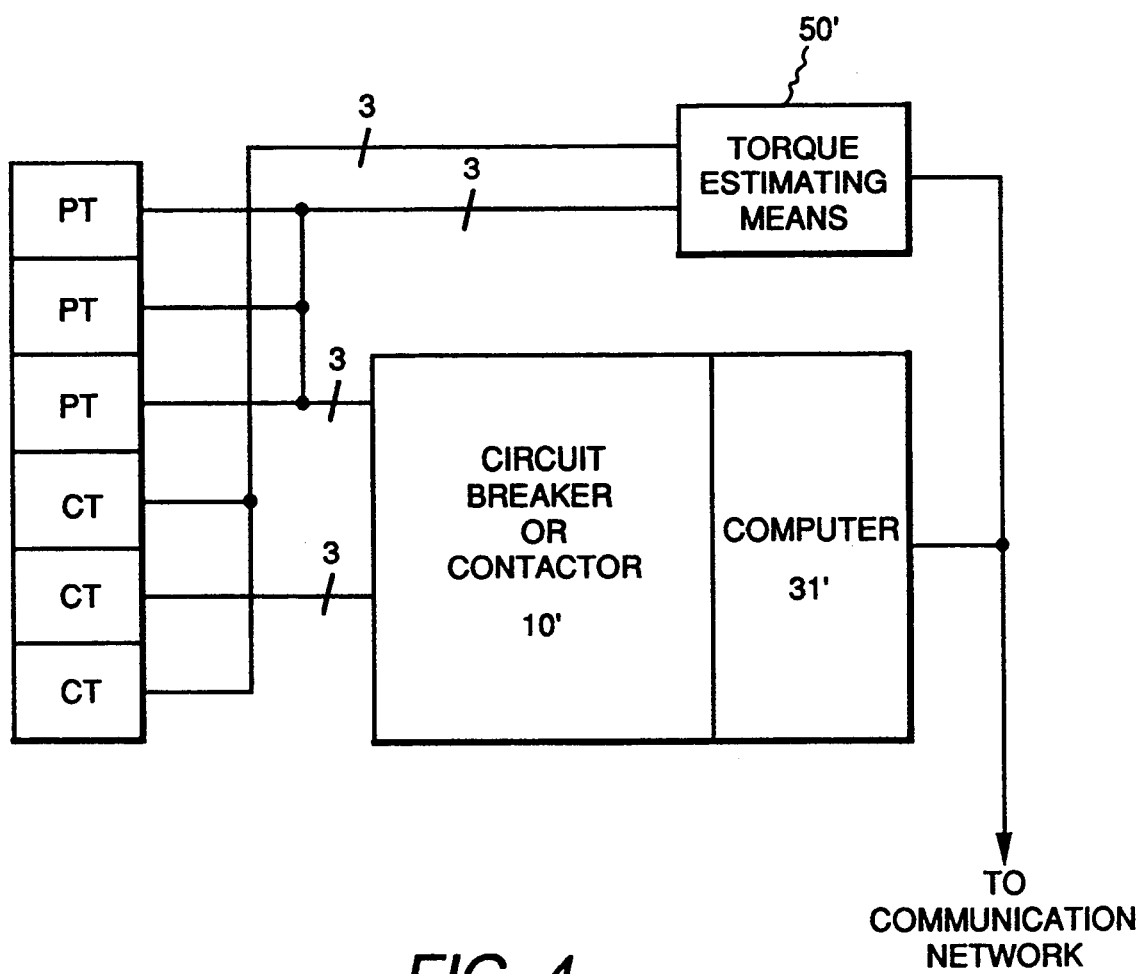
FIG. 4 schematically illustrates an alternative embodiment of the circuit breaker or contactor of FIG. 2.

In still another alternative embodiment, as illustrated schematically in FIG. 4, there are three modules for containing:

(1) the current and voltage sensors (shown as current transformers CT's and potential transformers PT's, respectively);

(2) the circuit breaker or contactor 10' with a modified computer system 31' (i.e., without the torque estimating means); and (3) torque estimating means 50'. For this embodiment, the torque estimating means includes its own electronics, i.e., A/D converters and controls, separate from those of circuit breaker or contactor 10'.

Advantageously, a circuit breaker according to the present invention provides overcurrent and undervoltage protection and precise torque estimating capability within a single package. Similarly, a contactor according to the present invention includes torque estimating capability. Hence, the state of a motor-driven load can be accurately and reliably determined as well as the nature of faults in the motor or load.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A circuit breaker for use in a system driven by a motor, comprising:

current sensing means for measuring current in each respective phase of the motor;

voltage sensing means for measuring voltage across each respective phase of the motor;

actuating means for controlling contacts operatively connected within each respective phase of the motor, said actuating means operating said contacts in response to indication of one of an overcurrent condition by the current sensing means and an undervoltage condition by the voltage sensing means, respectively; and computer means for receiving the measured current in each respective phase and the measured voltage across each respective phase from said current sensing means and said voltage sensing means, respectively, and for controlling said actuating means in response thereto, said computer means further comprising torque estimating means for estimating torque output of the motor from the measured current in each respective phase and the measured voltage across each respective phase.

2. The circuit breaker of claim 1 in a three-phase system, said torque estimating means transforming the measured current in each respective phase and the measured voltage across each respective phase into a two-phase stator reference frame and deriving the estimated torque output $T_e$ as follows:

$$T_e = \frac{3}{2} p[\lambda_{sd} i_{sq} - i_{sd} \lambda_{sq}]$$

where p represents a stator pole pair number for said motor; and $\lambda_{sd}$, $\lambda_{sq}$, $i_{sd}$, and $i_{sq}$ are transformed two-phase components of stator fluxes of said motor and the measured current in each respective phase, respectively.

3. The circuit breaker of claim 1 wherein said current sensing means comprises current sensing transformers.

4. The circuit breaker of claim 1 wherein said voltage sensing means comprises potential transformers.

5. The circuit breaker of claim 1, further comprising a casing for enclosure thereof.

6. The circuit breaker of claim 1 wherein said current sensing means and said voltage sensing means are contained within a sensing module separate from said actuating means, said contacts, and said computer means.

7. The circuit breaker of claim 1, further comprising means for coupling said computer means to a communication means for remotely controlling said actuating means through said computer means.

8. The circuit breaker of claim 1 wherein said voltage and current sensing means, said actuating means, and said torque estimating means are each respectively packaged within a separate module.

9. A contactor for use in a system driven by a motor, comprising:

current sensing means for measuring current in each respective phase of the motor;

voltage sensing means for measuring voltage across each respective phase of the motor;

actuating means for controlling contacts operatively connected within each respective phase of the motor, said actuating means operating said contacts in response to a control signal; and computer means for receiving the measured current in each respective phase and the measured voltage across each respective phase from said current sensing means and said voltage sensing means, respectively, and for controlling said actuating means in response thereto, said computer means further comprising torque estimating means for estimating torque output of the motor from the measured current in each respective phase and the measured voltage across each respective phase.

10. The contactor of claim 9 in a three-phase system, said torque estimating means transforming the measured current in each respective phase and the measured voltage across each respective phase into a two-phase stator reference frame and deriving the estimated torque output $T_e$ as follows:

$$T_e = \frac{3}{2} p[\lambda_{sd} i_{sq} - i_{sd} \lambda_{sq}]$$

where p represents a stator pole pair number for said motor; and $\lambda_{sd}$, $\lambda_{sq}$, $i_{sd}$, and $i_{sq}$ are transformed two-phase components of stator fluxes of said motor and the measured current in each respective phase, respectively.

11. The contactor of claim 9 wherein said current sensing means comprises current sensing transformers.

12. The contactor of claim 9 wherein said voltage sensing means comprises potential transformers.

13. The contactor of claim 9, further comprising a casing for enclosure thereof.

14. The contactor of claim 9 wherein said current sensing means and said voltage sensing means are contained within a sensing module separate from said actuating means, said contacts, and said computer means.

15. The contactor of claim 9, further comprising means for coupling said computer means to a communication means for remotely controlling said actuating means through said computer means.

16. The contactor of claim 9 wherein said voltage and current sensing means, said actuating means, and said torque estimating means are each respectively packaged within a separate module.

17. An electrical distribution system in a control center for a motor, comprising:

current sensing means for measuring current in each respective phase of the motor;

voltage sensing means for measuring voltage across each respective phase of the motor;

actuating means for controlling contacts operatively connected within each respective phase of the motor, said actuating means operating said contacts in response to indication of one of an overcurrent condition by the current sensing means and an undervoltage condition by the voltage sensing means, respectively:

computer means for controlling said actuating means in response thereto, said computer means further comprising torque estimating means for receiving the measured current in each respective phase and the measured voltage across each respective phase from said current sensing means and said voltage sensing means, respectively, and for estimating torque output of the motor therefrom; and means for coupling said torque estimating means to a communication means for remotely controlling a motor in response to the estimated torque output from said torque estimating means.

18. The electrical distribution system of claim 17 comprising a three-phase system, said torque estimating means transforming the measured current in each respective phase and the measured voltage across each respective phase into a two-phase stator reference frame and deriving the estimated torque output $T_e$ as follows:

$$T_e = \frac{3}{2} p[\lambda_{sd} i_{sq} - i_{sd} \lambda_{sq}]$$

where p represents a stator pole pair number for said motor, and $\lambda_{sd}$, $\lambda_{sq}$, $i_{sd}$, and $i_{sq}$ are transformed two-phase components of stator fluxes of said motor and the measured currents, respectively.

19. The electrical distribution system of claim 17 wherein said current sensing means comprises current sensing transformers.

20. The electrical distribution system of claim 17 wherein said voltage sensing means comprises potential transformers.

21. The electrical distribution system of claim 17 wherein said current sensing means and said voltage sensing means are contained within a sensing module separate from said torque estimating means.

* * * * *